(12) United States Patent
Ke et al.

(10) Patent No.: US 12,490,519 B2
(45) Date of Patent: Dec. 2, 2025

(54) SEMICONDUCTOR DEVICE INCLUDING ZENER DIODE RING AND MANUFACTURING METHOD OF FORMING THE SAME

(71) Applicant: PANJIT INTERNATIONAL INC., Kaohsiung (TW)

(72) Inventors: Yijyun Ke, Zhubei (TW); Seungchul Lee, San Jose, CA (US)

(73) Assignee: PANJIT INTERNATIONAL INC., Kaohsiung (TW)

( * ) Notice: Subject to any disclaimer, the term of this patent is extended or adjusted under 35 U.S.C. 154(b) by 408 days.

(21) Appl. No.: 18/048,440

(22) Filed: Oct. 20, 2022

(65) Prior Publication Data

US 2024/0136348 A1 Apr. 25, 2024
US 2024/0234405 A9 Jul. 11, 2024

(51) Int. Cl.
*H10D 89/60* (2025.01)
*H10D 8/01* (2025.01)
*H10D 8/25* (2025.01)
*H10D 62/832* (2025.01)
*H10D 64/01* (2025.01)
*H10D 64/23* (2025.01)

(52) U.S. Cl.
CPC .......... *H10D 89/611* (2025.01); *H10D 8/022* (2025.01); *H10D 8/25* (2025.01); *H10D 62/8325* (2025.01); *H10D 64/01* (2025.01); *H10D 64/258* (2025.01); *H10D 89/931* (2025.01)

(58) Field of Classification Search
CPC .. H10D 89/611; H10D 89/931; H10D 64/258; H10D 64/01; H10D 8/022; H10D 8/25; H10D 62/8325
USPC ........................................................ 257/288
See application file for complete search history.

(56) References Cited

U.S. PATENT DOCUMENTS

| | | | | |
|---|---|---|---|---|
| 5,736,779 A | * | 4/1998 | Kobayashi | H10D 62/112 257/357 |
| 2002/0050602 A1 | * | 5/2002 | Narazaki | H01L 24/05 257/104 |
| 2009/0039432 A1 | * | 2/2009 | Nishimura | H10D 8/25 257/362 |
| 2015/0048450 A1 | * | 2/2015 | Naito | H10D 62/106 438/479 |
| 2021/0226053 A1 | * | 7/2021 | Hoshi | H10D 30/669 |

* cited by examiner

*Primary Examiner* — Norman D Richards
*Assistant Examiner* — Colin Russell McCutcheon

(57) ABSTRACT

A semiconductor device and a manufacturing method of forming the semiconductor device are provided. The semiconductor device includes an active area and a periphery area surrounding the active area, the semiconductor device includes a semiconductor substrate, an epitaxial layer, a field oxide layer, a polysilicon layer, a dielectric layer and a metal contact layer. The semiconductor substrate has a silicon carbide layer. The epitaxial layer is disposed on the semiconductor layer and the epitaxial layer has a doped layer. The polysilicon layer is disposed on the field oxide layer. The polysilicon layer at the periphery area has a plurality of P-plus regions and a plurality of N-plus regions and the plurality of P-plus regions and the plurality of N-plus regions are alternatively arranged to form a zener diode.

9 Claims, 18 Drawing Sheets

SEMICONDUCTOR DEVICE INCLUDING ZENER DIODE RING AND MANUFACTURING METHOD OF FORMING THE SAME

BACKGROUND OF THE INVENTION

1. Field of the Invention

The present invention generally relates to a semiconductor device and a manufacturing method of forming the semiconductor device, and in particular, to the semiconductor device containing the zener diode at the polysilicon gate and the manufacturing method of forming the same.

2. Description of the Related Art

The power semiconductor device includes insulated gate bipolar transistors (IGBTs) and metal oxide semiconductor field effect transistor (MOSFET) device. The silicon carbide MOSFET has critical breakdown strength, can operate at much higher temperatures, provide higher current density and support higher switching frequencies.

Although the semiconductor device has the above-mentioned advantages, the gate oxide of silicon carbide MOSFET is weak on voltage spiking induced on gate bias during operation and the electro static discharge (ESD) stress because of thin gate oxide thickness and low oxide quality. In the conventional technology, the semiconductor device may add the additional device for protecting the gate oxide from voltage overshot and ESD stress. However, the additional device has to add additional space for deposing the relative structure and the cell pitch of the semiconductor device will increase, which is not for the right direction of device development. The conventional device and the manufacturing process are not suitable for forming the silicon carbide MOSFET device.

In summary, the conventional semiconductor device and the conventional manufacturing method for forming the semiconductor device still has considerable problems. Hence, the present disclosure provides the semiconductor device and the manufacturing method of forming the semiconductor device to resolve the shortcomings of conventional technology and promote industrial practicability.

SUMMARY OF THE INVENTION

In view of the aforementioned technical problems, the primary objective of the present disclosure is to provide a semiconductor device and a manufacturing method of forming the semiconductor device, which are capable of forming the zener diode at the polysilicon gate without adding additional area.

In accordance with one objective of the present disclosure, a semiconductor device is provided. The semiconductor device includes an active area and a periphery area surrounding the active area, the semiconductor device includes a semiconductor substrate, an epitaxial layer, a field oxide layer, a polysilicon layer, a dielectric layer and a metal contact layer. The semiconductor substrate has a silicon carbide layer. The epitaxial layer is disposed on the semiconductor layer and the epitaxial layer has a doped layer located at top surface of the epitaxial layer. The field oxide layer is disposed on the epitaxial layer. The polysilicon layer is disposed on the field oxide layer. The polysilicon layer at the periphery area has a plurality of P-plus regions and a plurality of N-plus regions and the plurality of P-plus regions and the plurality of N-plus regions are alternatively arranged to form a zener diode. The dielectric layer covers the polysilicon layer and the dielectric layer has a first contact hole at the active area and a second contact hole at the periphery area. The metal contact layer includes a source metal and a gate metal. The source metal electrically connects to the doped layer through the first contact hole, and the source metal and the gate metal electrically connect to the zener diode through the second contact hole.

Preferably, the plurality of P-plus regions and the plurality of N-plus regions may be formed in a ring shape, the ring shape has rounded corners and each doped ring region of the plurality of P-plus regions and the plurality of N-plus regions surrounds the second contact hole connected to the source metal.

Preferably, each doped ring region of the plurality of P-plus regions and the plurality of N-plus regions may have a region width.

Preferably, the plurality of P-plus regions may include first P-plus regions and second P-plus regions, and the N-plus regions, the first P-plus regions and the second P-plus regions are alternatively arranged to form the zener diode, wherein the first P-plus regions have higher doping concentration than the second P-plus regions.

Preferably, the plurality of N-plus regions may include first N-plus regions and second N-plus regions, and the first N-plus regions, the second N-plus regions and the P-plus regions are alternatively arranged to form the zener diode, wherein the first N-plus regions have higher doping concentration than the second N-plus regions.

Preferably, the plurality of P-plus regions may be implanted by boron ions and the plurality of N-plus regions may be implanted by phosphorus ions.

Preferably, the doped layer may include a P-well layer, a N-plus layer and a P-plus layer, the N-plus layer is disposed within the P-well layer and the P-plus layer is adjacent to the N-plus layer.

Preferably, the N-plus layer may be implanted by nitrogen ions and the P-plus layer may be implanted by aluminum ions.

Preferably, the source metal electrically may connect to the N-plus layer and the P-plus layer through the first contact hole.

Preferably, a nickel layer may be disposed between the source metal and the doped layer.

In accordance with one objective of the present disclosure, a manufacturing method of forming a semiconductor device is provided. The manufacturing method includes the following steps of: providing a semiconductor substrate and disposing an epitaxial layer on the semiconductor substrate, the semiconductor substrate having a silicon carbide layer; forming a current spreading layer to define an active area and a periphery area surrounding the active area; conducting a first implant process to a front surface of the epitaxial layer to form a doped layer; forming a field oxide layer on the epitaxial layer by a field oxide deposition process; forming a polysilicon layer on the field oxide layer by a gate polysilicon deposition process; conducting a second implant process to the polysilicon layer to form a plurality of P-plus regions and a plurality of N-plus regions, the plurality of P-plus regions and the plurality of N-plus regions at the periphery area being alternatively arranged; etching the plurality of P-plus regions and the plurality of N-plus regions to define a zener diode at the periphery area and a polysilicon gate at the active area; forming a dielectric layer by an interlayer dielectric deposition process to cover the zener diode and the polysilicon gate; etching the dielectric layer to form a first contact hole at the active area and a second contact hole at the periphery area; forming a metal contact layer by a metal deposition process, the metal contact layer being etched to define a source metal and a gate metal, the source metal electrically connecting to the doped layer through the first contact hole, the source metal and the gate metal electrically connecting to the zener diode through the second contact hole.

Preferably, the plurality of P-plus regions and the plurality of N-plus regions may be formed in a ring shape, the ring shape has rounded corners and each doped ring region of the plurality of P-plus regions and the plurality of N-plus regions surrounds the second contact hole connected to the source metal.

Preferably, each doped ring region of the plurality of P-plus regions and the plurality of N-plus regions may have a region width.

Preferably, the plurality of P-plus regions may include first P-plus regions and second P-plus regions, and the N-plus regions, the first P-plus regions and the second P-plus regions are alternatively arranged to form the zener diode, wherein the first P-plus regions have higher doping concentration than the second P-plus regions.

Preferably, the plurality of N-plus regions may include first N-plus regions and second N-plus regions, and the first N-plus regions, the second N-plus regions and the P-plus regions are alternatively arranged to form the zener diode, wherein the first N-plus regions have higher doping concentration than the second N-plus regions.

Preferably, the second implant process may include a phosphorus implant for forming the plurality of N-plus regions and a boron implant for forming the plurality of P-plus regions.

Preferably, an annealing process may be provided after the second implant process.

Preferably, the first implant process may include a P-well implant process for forming a P-well layer, a nitrogen implant for forming a N-plus layer and an aluminum implant for forming a P-plus layer. The N-Plus layer is disposed within the P-well layer and the P-plus layer is adjacent to the N-plus layer.

Preferably, an annealing process may be provided after the first implant process.

Preferably, a nickel deposition process may be provided to form a nickel layer is between the source metal and the doped layer.

As mentioned previously, the semiconductor device and the manufacturing method of forming the semiconductor device in accordance with the present disclosure may have one or more advantages as follows.

1. The semiconductor device and the manufacturing method of forming the semiconductor device are capable of using simple process to form the zener diode on the polysilicon gate pad with PN continuous structure The semiconductor device does not need the external parts for the gate protection and it will provide stable gate ruggedness without any occupying active area of silicon carbide MOSFET for protection.

2. The semiconductor device and the manufacturing method of forming the semiconductor device may have good isolation from other junction in MOSFET operation and the protection is controllable by design of number of back to back zener diode in series.

3. The semiconductor device and the manufacturing method of forming the semiconductor device enables smaller cell pitch of silicon carbide MOSFET, which makes lower specific on-resistance.

4. The semiconductor device and the manufacturing method of forming the semiconductor device may form the different doping concentration area in P-plus regions or N-plus regions, so as to control the break down voltage in the back or forth direction.

BRIEF DESCRIPTION OF THE DRAWINGS

The technical features, detail structures, advantages and effects of the present disclosure will be described in more details hereinafter with reference to the accompanying drawings that show various embodiments of the invention as follows.

DETAILED DESCRIPTION OF THE PREFERRED EMBODIMENTS

Figure 1A:
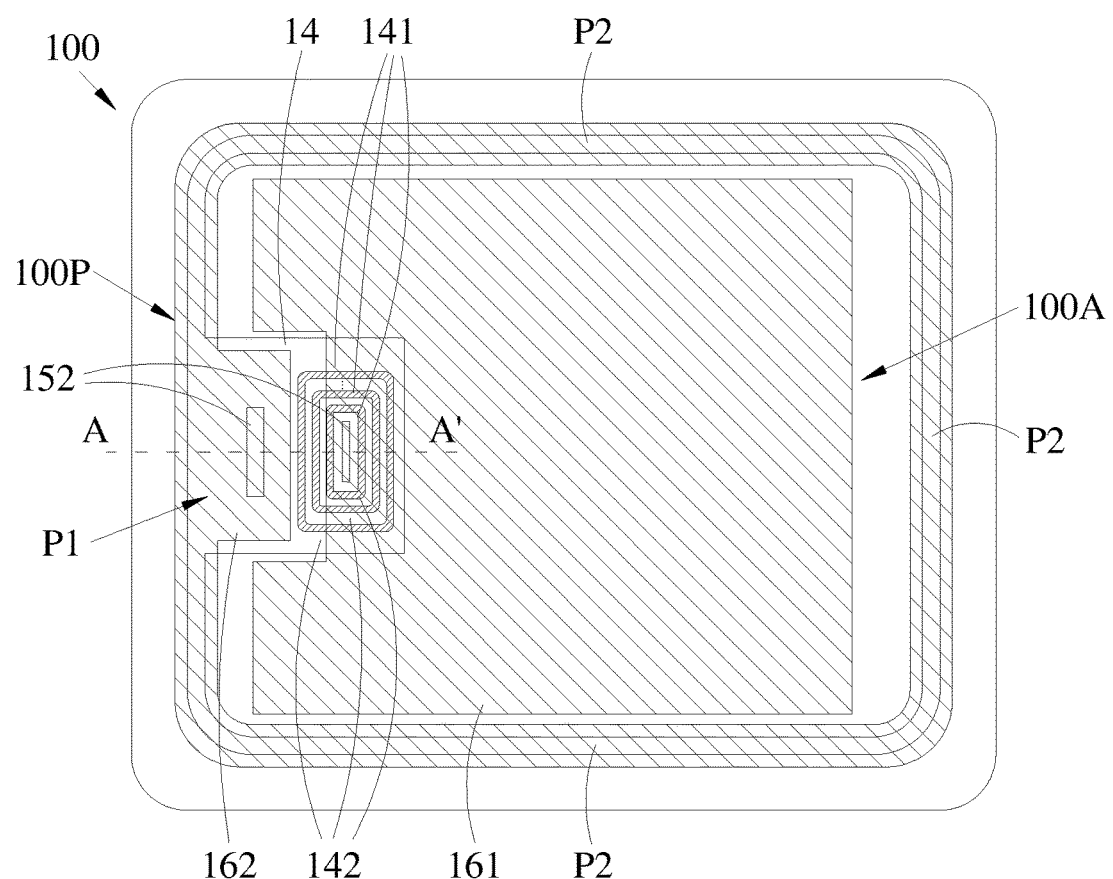
FIG. 1A and FIG. 1B are the schematic diagrams of the semiconductor device in accordance with the embodiment of the present disclosure.

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

Figure 1B:
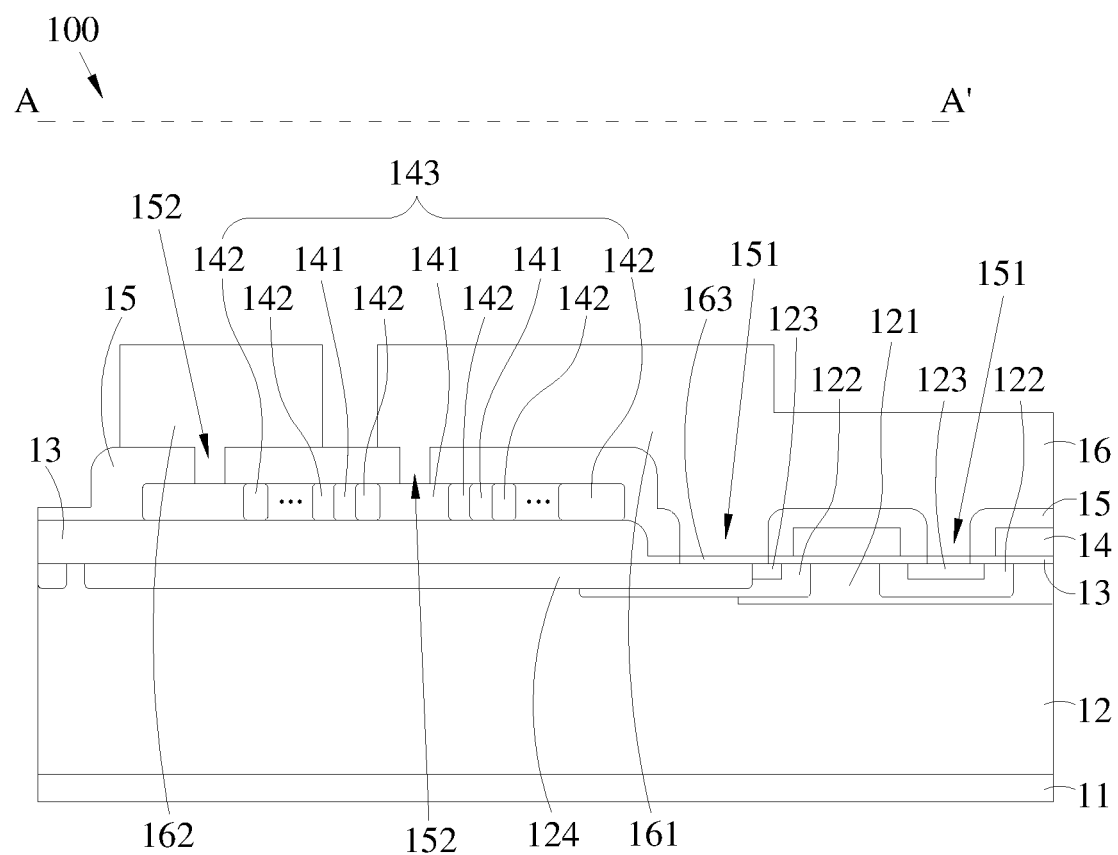

Please refer to FIG. 1A and FIG. 1B, which are schematic diagrams of the semiconductor device in accordance with the embodiment of the present disclosure. FIG. 1A shows the top view of a semiconductor device 100. FIG. 1B shows the section view of the semiconductor device along the dash line AA' of the FIG. 1A.

As shown in FIG. 1A and FIG. 1B, the semiconductor device 100 includes an active area 100A and a periphery area 100P. The periphery area 100P includes the gate polysilicon pad area P1 and the gate polysilicon runner area P2. The periphery area 100P surrounds the active area 100A. The semiconductor device 100 is designed to withstand high voltage, and the active area 100A may drive with high current. To prevent voltage breakdown or other channel effect, the periphery area 100P is disposed around the active area 100A to prevent the above effects. The active area 100A also isolates the influence from the external components.

The semiconductor device 100 includes a semiconductor substrate 11, an epitaxial layer 12, a field oxide layer 13, a polysilicon layer 14, a dielectric layer 15 and a metal contact layer 16. The semiconductor substrate 11 has a silicon carbide layer. An epitaxial growth process is provided to dispose the N type epitaxial layer 12 on the semiconductor substrate 11. The epitaxial layer 12 has a doped layer located at top surface of the epitaxial layer 12. The doped layer is formed by the implant process to the epitaxial layer 12 and an anneal process is provided after the implant process. At the active area 100A, the doped layer includes a current spreading layer 121, a P-well layer 122 and the N-plus layer 123. The current spreading layer 121 is formed at top surface of the epitaxial layer 12. The P-well layer 122 is formed in the current spreading layer 121 and the N-plus layer 123 is disposed within the P-well layer 122. At the periphery area 100P and the junction area between the active area 100A and the periphery area 100P, the doped layer includes a P-plus layer 124. The P-plus layer 124 is adjacent to the N-plus layer 123. In the present embodiment, the N-plus layer 123 is implanted by the nitrogen ions and the P-plus layer 124 is implanted by the aluminum ions.

The field oxide layer 13 is disposed on the epitaxial layer 21 by a field oxide deposition process. The field oxide layer 13 covers the doped layer. The polysilicon layer 14 is disposed on the field oxide layer 13 by a gate polysilicon deposition process. At the active area 100A, the polysilicon layer 14 is used as the gate structure. At the periphery area 100P, the polysilicon layer 14 is a polysilicon gate pad disposed on the field oxide layer 13. In order to protect the gate oxide layer from the voltage overshot and the electro static discharge (ESD) stress, the present disclosure provide a plurality of N-plus regions 141 and a plurality of P-plus regions 142 in the polysilicon gate pad. The plurality of P-plus regions 142 and the plurality of N-plus regions 141 are alternatively arranged to form a zener diode 143. The numbers of the doped regions are not limited in the present disclosure. The numbers of the doped regions can be determined by the protection requirements for the semiconductor device 100.

The zener diode 143 includes a back to back structure connected by the plurality of P-plus regions 142 and the plurality of N-plus regions 141. To form the above structure, the highly doped regions are formed by implanting the undoped polysilicon layer 14. The P-plus regions 142 are implanted by boron ions and the N-plus regions 141 are implanted by phosphorus ions. In the present embodiment, the plurality of P-plus regions 142 and the plurality of N-plus regions 141 are formed in a ring shape. The ring shape may be rectangle and may have rounded corners to increase the protection at the corners.

The dielectric layer 15 covers the polysilicon layer 14. That is, the dielectric layer 15 covers the gate structure at the active area 100A and covers the zener diode 143 at the periphery area 100P. The dielectric layer 15 has a first contact hole 151 at the active area 100A and a second contact hole 152 at the periphery area 100P. The first contact hole 151 is formed to expose the doped layer, so that the metal contact can electrically connect to the doped layer. At the periphery area 100P, the second contact hole 152 is formed to expose the polysilicon layer 14, so that the P-plus regions 142 and the N-plus regions 141 may electrically connect to the metal contact for forming the zener diode 143.

The metal contact layer 16 includes a source metal 161 and a gate metal 162. The source metal 161 electrically connects to the doped layer through the first contact hole 151, and the source metal 161 and the gate metal 162 electrically connect to the zener diode 143 through the second contact hole 152. The source metal 161 electrically connects to the N-plus layer 123 and the P-plus layer 124 through the first contact hole 151. In the first contact hole 151, a nickel layer 163 is disposed between the source metal 161 and the doped layer. The second contact hole 152 includes two parts, one is contact to the source metal 161 and the other one is contact to the gate metal 162. The ring shape of the P-plus regions 142 and the N-plus regions 141 surrounds the second contact hole to the source metal 161. The second contact hole to the gate metal 162 electrically connects to the polysilicon layer 14. Therefore, the alternating P-plus regions 142 and N-plus regions 141 are connected to the source metal 161 and the gate metal 162 for operating the zener diode 143.

Figure 2A:
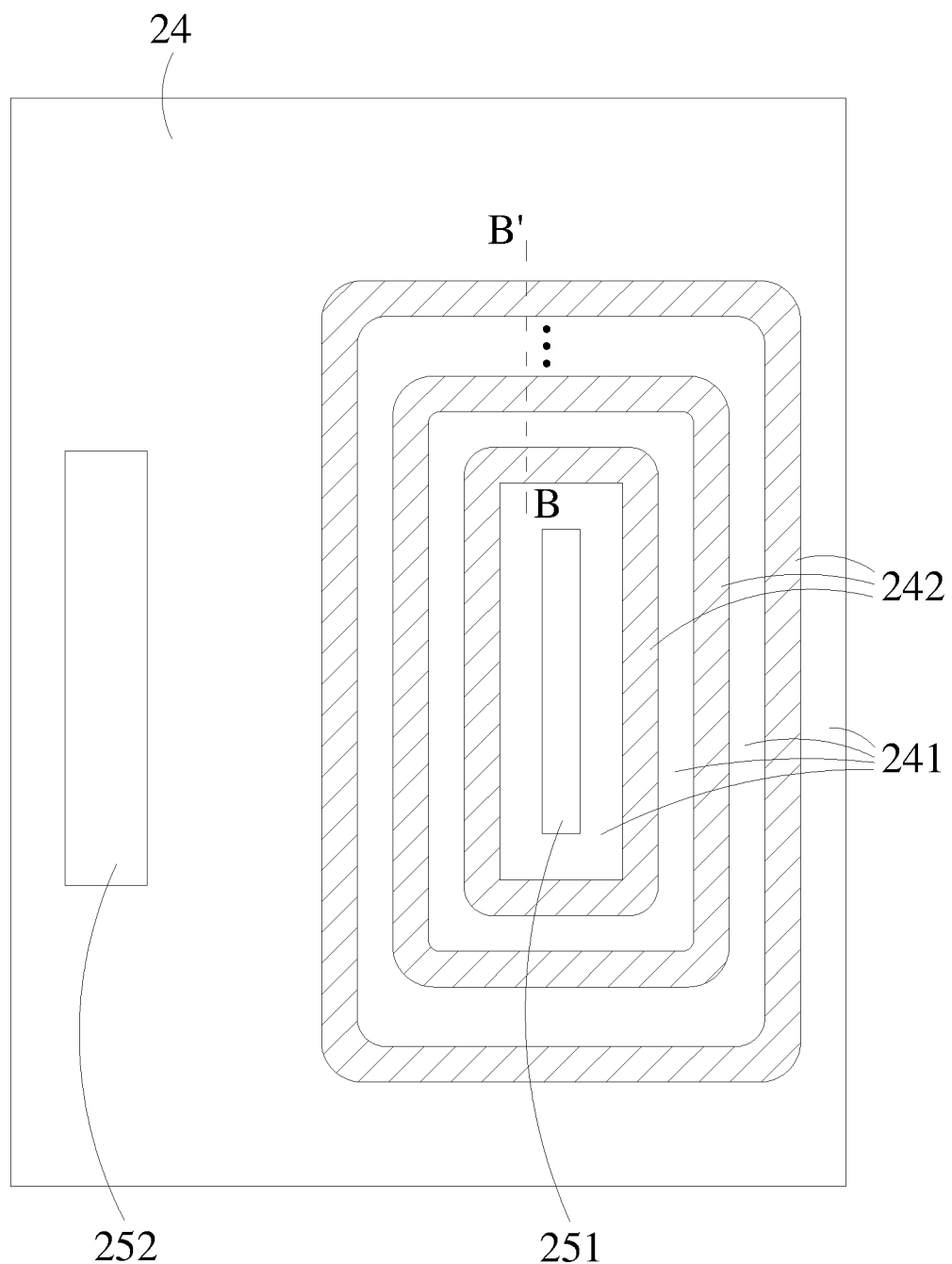
FIG. 2A and FIG. 2B are the schematic diagrams of the zener diode of the semiconductor device in accordance with the embodiment of the present disclosure.
Figure 2B:
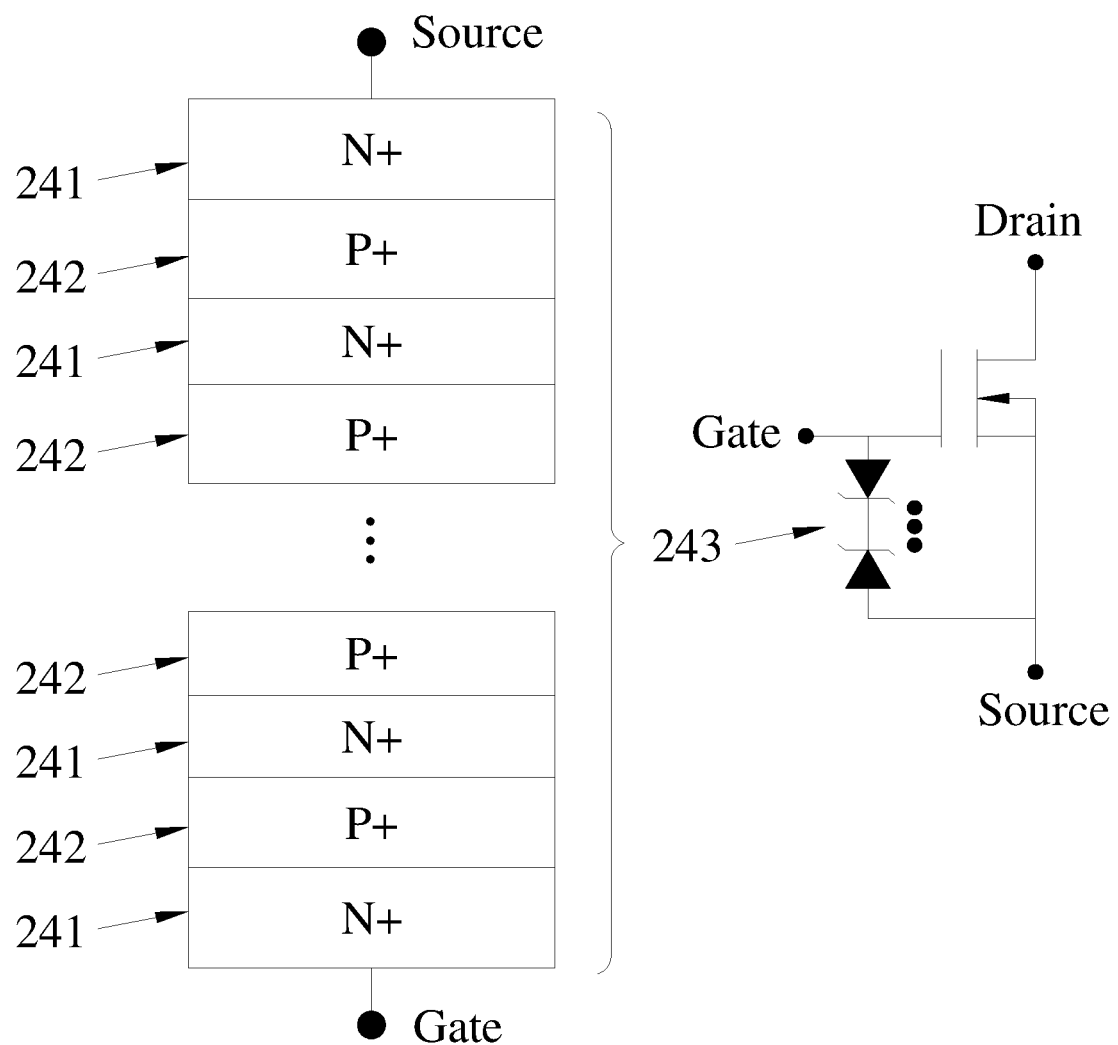

Please refer to FIG. 2A and FIG. 2B, which are the schematic diagrams of the zener diode of the semiconductor device in accordance with the embodiment of the present disclosure. FIG. 2A shows the top view of a polysilicon layer 24 with P-plus regions 242 and N-plus regions 241. FIG. 2B shows the section view of the zener diode along the dash line BB' of the FIG. 2A.

In FIG. 2A, the polysilicon layer 24 are highly doped to form the P-plus regions 242 and N-plus regions 241. The undoped gate polysilicon layer is firstly formed on the field oxide layer. The N-plus mask is used to define the location of the N-plus regions 241 and the phosphorus ions are implanted to the polysilicon layer 24 to form the N-plus regions 241. The N-plus mask is ring shape and the thickness of the ring shape mask can be the same. After the N-plus implant process, the N-plus regions may have the same region width. Similar to the N-plus regions 241, the P-plus mask is used to define the location of the P-plus regions 242 and the boron ions are implanted to the polysilicon layer 24 to form the P-plus regions 242. The P-plus regions 242 may also have the same region width. The annealing process is provided after the implant process. In other embodiment, the N-plus mask and the P-plus mask may have different doped region widths.

In the conventional semiconductor device, the P-plus and N-plus regions may form by stripe pattern. That is, the highly doped regions are not connected at the stripe ends. The stripe pattern may be easy to make. However, the end of the stripe may cause leakage current. Therefore, the concentric circular pattern, like the ring shape used in the present disclosure, is able to prevent such leakage current. The N-plus ring shape and the P-plus ring shape are surrounded to the contact hole 251 connected to the source contact. The inner ring of the N-plus region 241 connects the contact hole 251 connected to the source contact and the outer ring of the N-plus region 241 connects the contact hole 252 connected to the gate contact. As shown in FIG. 2B, the PN continuous structure connects the source metal and the gate metal, so as to form the zener diode 243. The equivalent circuit is also shown in FIG. 2B.

In the conventional silicon carbide semiconductor device, the gate oxide layer is weak on voltage spiking induced on gate during operation and ESD stress because of thin gate oxide thickness and low oxide quality. In order to protect the gate oxide from voltage overshot and ESD stress, the zener diode 243 is formed. The zener diode 243 formed at polysilicon layer provides the advantage of the design space. The zener diode 243 does not need additional space to place the structure. In addition, the proposed structure provides very good isolation from other device structure for MOSFET operation. The connection to the gate electrode and the source electrode can be easily made, and the simple process of forming the semiconductor device will be described in following embodiment.

Figure 3A:
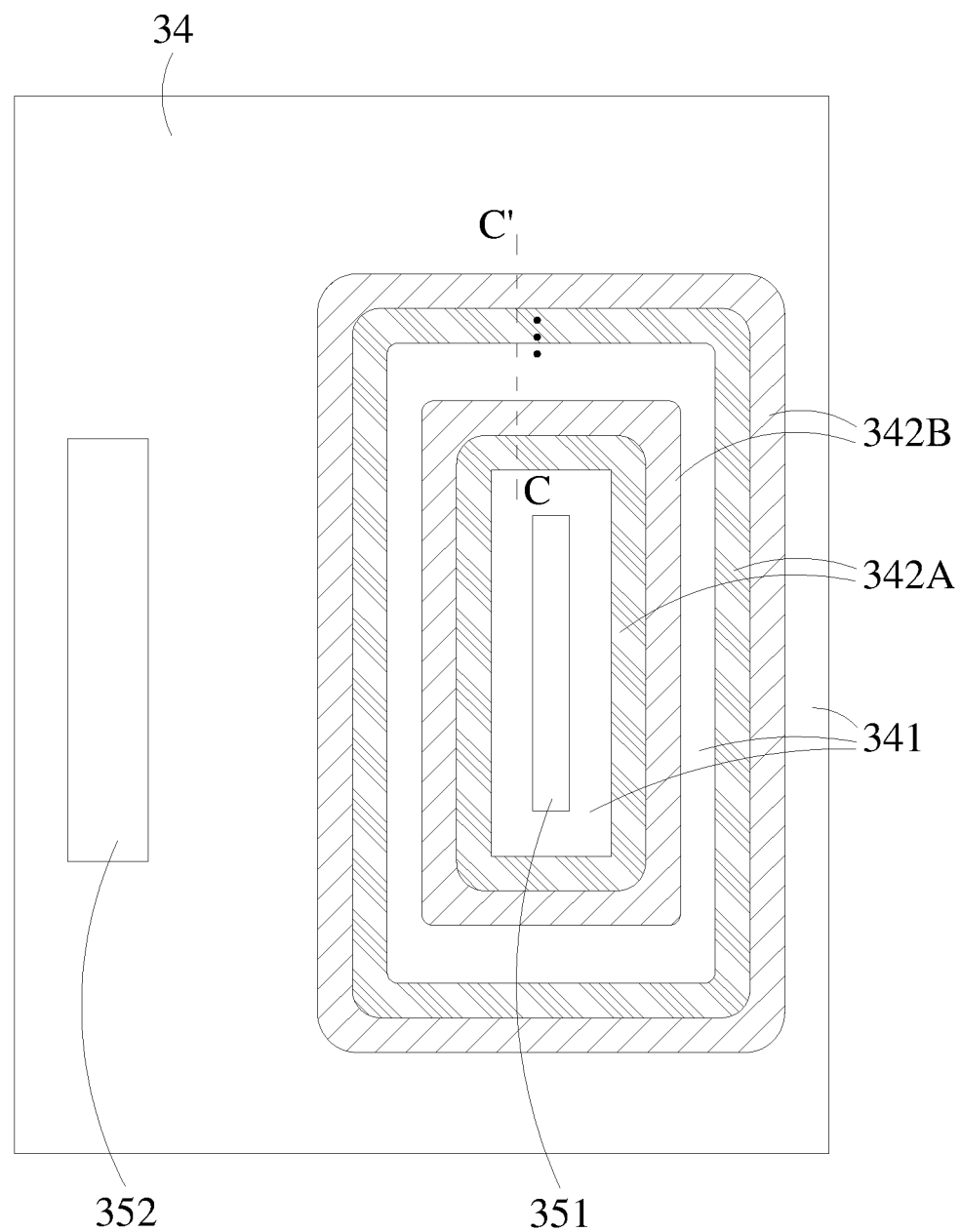
FIG. 3A to FIG. 3D are the schematic diagrams of the zener diode of the semiconductor device in accordance with another embodiment of the present disclosure.
Figure 3B:
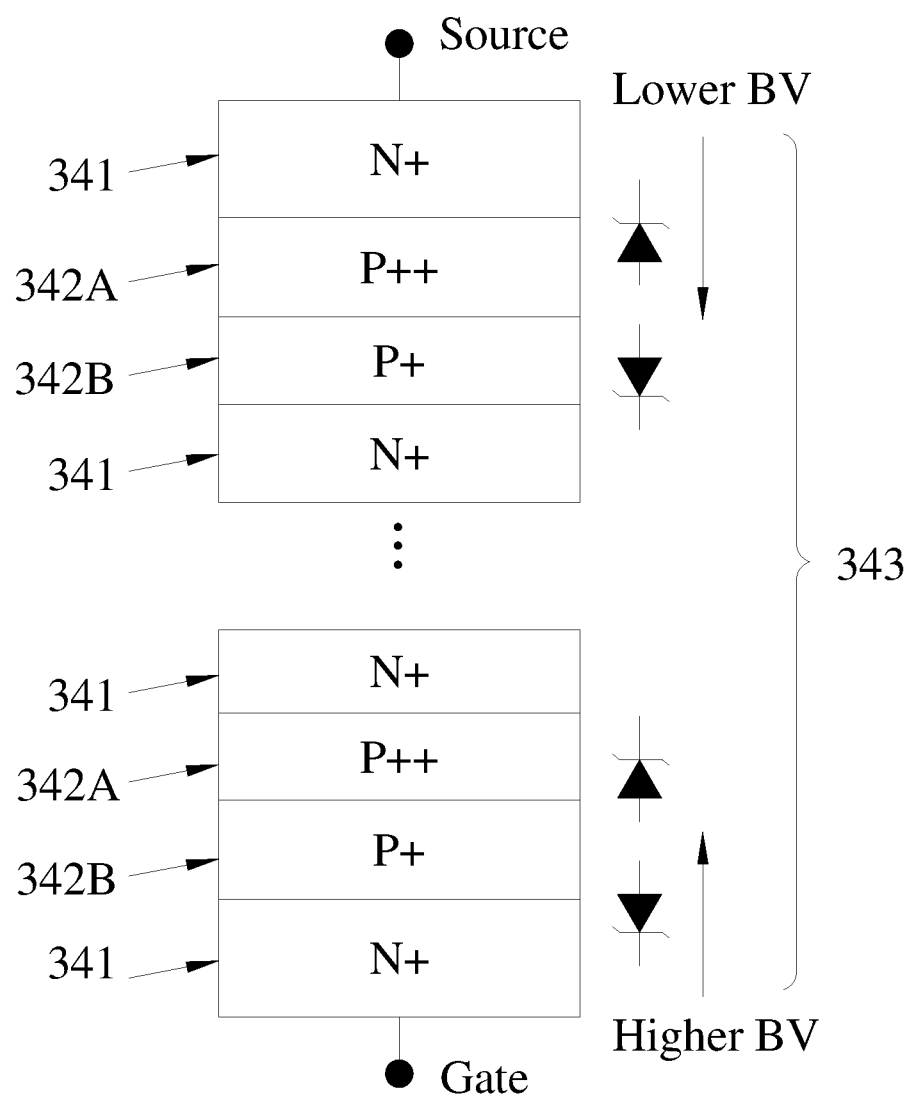
Figure 3C:
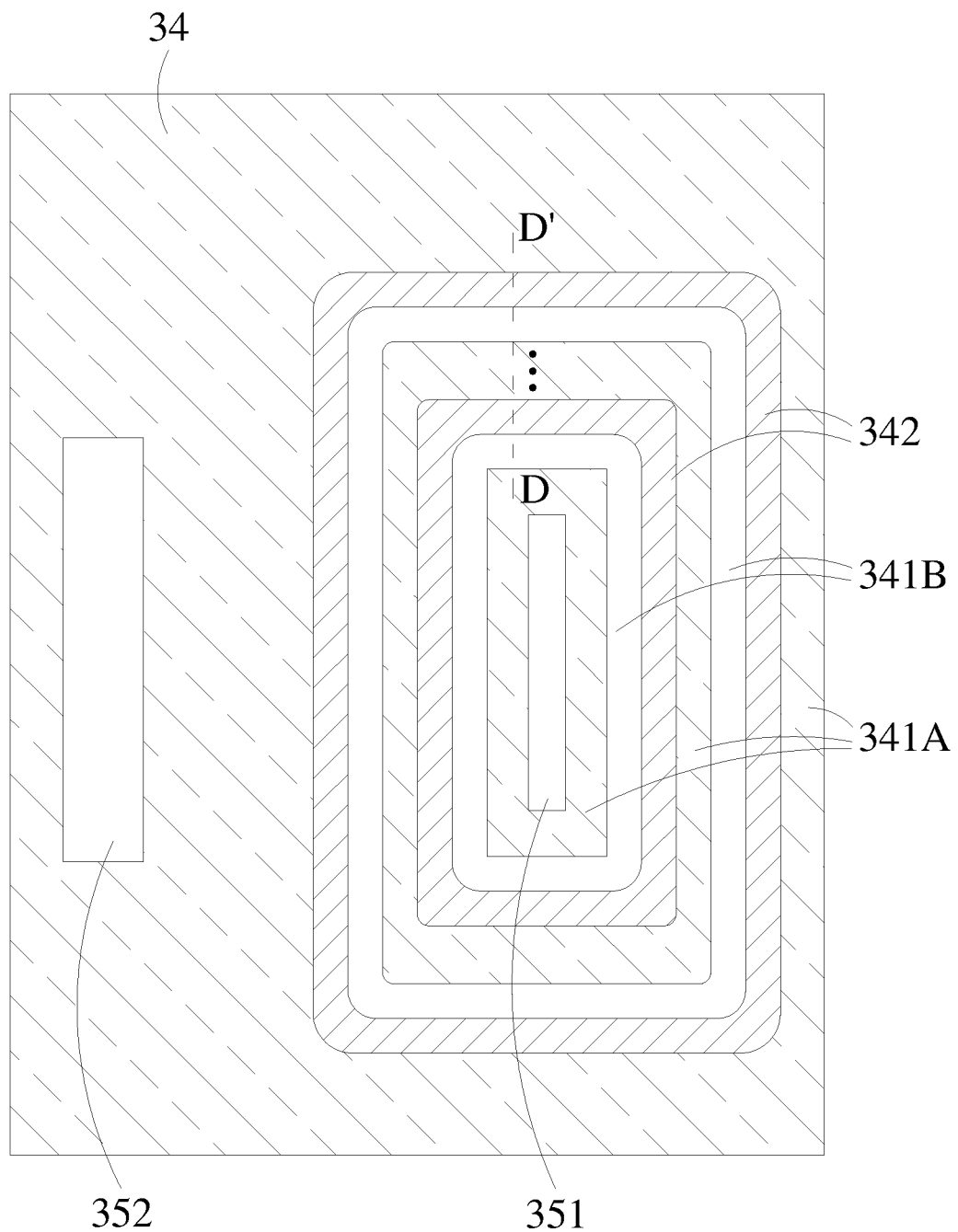
Figure 3D:
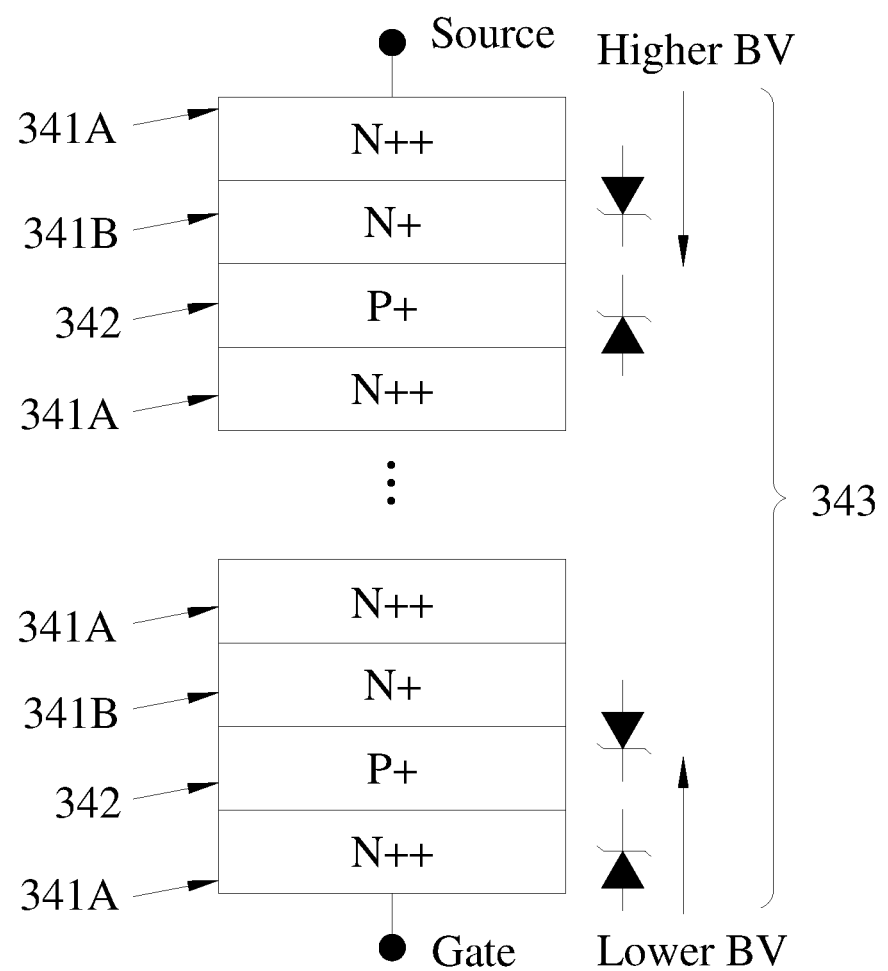

Please refer to FIG. 3A to FIG. 3D, which are the schematic diagrams of the zener diode of the semiconductor device in accordance with another embodiment of the present disclosure. FIG. 3A shows the top view of a polysilicon layer 34 with two P-plus regions. FIG. 3B shows the section view of the zener diode 343 along the dash line CC' of the FIG. 3A. FIG. 3C shows the top view of a polysilicon layer 34 with two N-plus regions. FIG. 3D shows the section view of the zener diode 343 along the dash line DD' of the FIG. 3C.

In FIG. 3A, the polysilicon layer 34 are highly doped to form the P-plus regions and N-plus regions. The undoped gate polysilicon layer is firstly formed on the field oxide layer. The N-plus mask is used to define the location of the N-plus regions 341 and the phosphorus ions are implanted to the polysilicon layer 34 to form the N-plus regions 341. The N-plus mask is ring shape and the thickness between two N-plus regions 341 is larger than the thickness of the N-plus regions 341. After the N-plus implant process, the first P-plus mask is used to define the location of the first P-plus regions 342A and the boron ions are implanted to the polysilicon layer 34 to form the first P-plus regions 342A. Then the second P-plus mask is used to define the location of the second P-plus regions 342B and the boron ions are implanted to the polysilicon layer 34 to form the second P-plus regions 342B. The first P-plus regions 342A have higher doping concentration than the second P-plus regions 342B. The annealing process is provided after the implant process.

In the present embodiment, the region width of each doped bone region of the plurality of the first P-plus regions 342A, the plurality of second P-plus regions 342B and the plurality of the N-plus regions 341 are the same. The P-plus regions include the first P-plus regions 342A and the second P-plus regions 342B may be thicker than the N-plus regions 341. Based on the additional higher doped P-plus implantation regions, the protection voltage in back and forth direction could be different.

The N-plus ring shape and the P-plus ring shape are surrounded to the contact hole 351 connected to the source contact. The inner ring of the N-plus region 341 connects the contact hole 351 connected to the source contact and the outer ring of the N-plus region 341 connects the contact hole 352 connected to the gate contact. As shown in FIG. 3B, the N-plus regions 341, the first P-plus regions 342A and the second P-plus regions 342B are alternatively arranged to form the zener diode. The direction from source to gate may have lower break down voltage and the direction from gate to source may have higher break down voltage.

In FIG. 3C, the polysilicon layer 34 are highly doped to form the P-plus regions and N-plus regions. The undoped gate polysilicon layer is firstly formed on the field oxide layer. The first N-plus mask is used to define the location of the first N-plus regions 341A and the phosphorus ions are implanted to the polysilicon layer 34 to form the first N-plus regions 341A. Then the second N-plus mask is used to define the location of the second N-plus regions 341B and the phosphorus ions are implanted to the polysilicon layer 34 to form the second N-plus regions 341B. The first N-plus regions 341A have higher doping concentration than the second N-plus regions 341B. After the N-plus implant process, the P-plus mask is used to define the location of the P-plus regions 342 and the boron ions are implanted to the polysilicon layer 34 to form the P-plus regions 342. The annealing process is provided after the implant process.

In the present embodiment, the region width of each doped bone region of the plurality of the first N-plus regions 341A, the plurality of second N-plus regions 341B and the plurality of the P-plus regions 342 are the same. The N-plus regions include the first N-plus regions 341A and the second N-plus regions 341B may be thicker than the P-plus regions 342. Based on the additional higher doped N-plus implantation regions, the protection voltage in back and forth direction could be different.

The N-plus ring shape and the P-plus ring shape are surrounded to the contact hole 351 connected to the source contact. The inner ring of the first N-plus region 341A connects the contact hole 351 connected to the source contact and the outer ring of the first N-plus region 341A connects the contact hole 352 connected to the gate contact. As shown in FIG. 3D, the first N-plus regions 341A, the second N-plus regions 341B and the P-plus regions 342 are alternatively arranged to form the zener diode. The direction from source to gate may have higher break down voltage and the direction from gate to source may have lower break down voltage.

In the conventional silicon carbide semiconductor device, the gate oxide layer is weak on voltage spiking induced on gate during operation and ESD stress because of thin gate oxide thickness and low oxide quality. In order to protect the gate oxide from voltage overshot and ESD stress, the zener diode 343 is formed. The zener diode 343 formed at polysilicon layer provides the advantage of the design space. The zener diode 343 does not need additional space to place the structure. In addition, the proposed structure provides very good isolation from other device structure for MOSFET operation. The connection to the gate electrode and the source electrode can be easily made, and the simple process of forming the semiconductor device will be described in following embodiment.

Please refer to FIG. 4A to FIG. 4J, which are the schematic diagrams of the manufacturing process of forming the semiconductor device in accordance with the embodiment of the present disclosure. FIG. 4A to FIG. 4J show the section view of the semiconductor device along the dash line AA' of the FIG. 1A.

Figure 4A:
FIG. 4A to FIG. 4J are the schematic diagrams of the manufacturing process of forming the semiconductor device in accordance with the embodiment of the present disclosure.

In FIG. 4A, manufacturing process provides a semiconductor substrate 41 and disposes an epitaxial layer 42 on the semiconductor substrate 41. The semiconductor substrate 41 may be a silicon carbide layer. The manufacturing process provides the epitaxial layer 42 and the epitaxial layer 42 has a first conductivity type, for example, an N-type lightly doped layer.

Figure 4B:
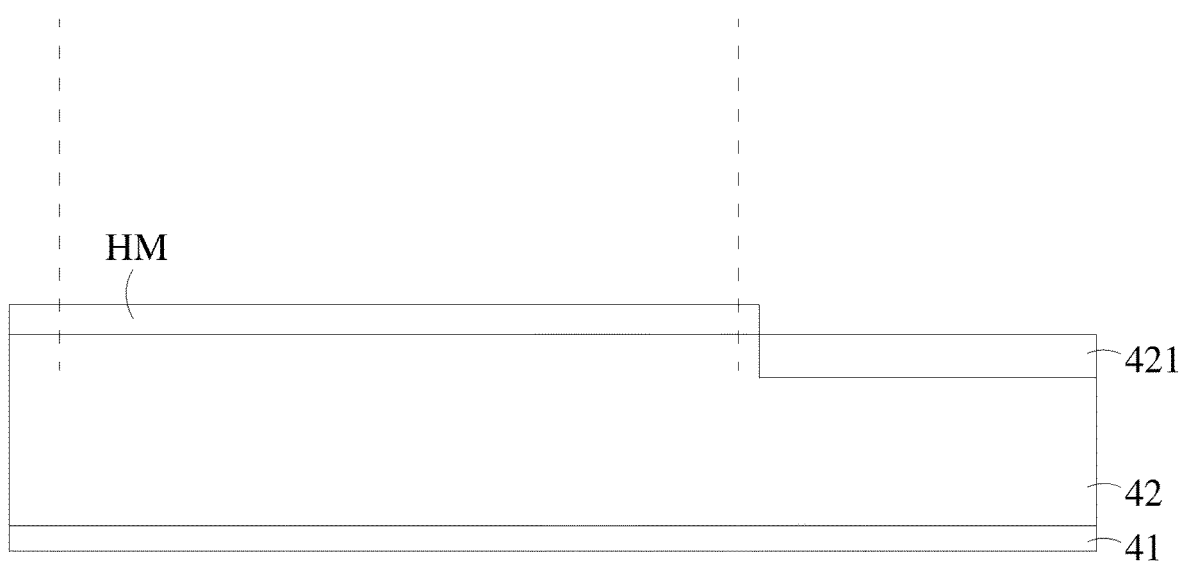

In FIG. 4B, the manufacturing process forms a current spreading layer 421 to define an active area and a periphery area surrounding the active area. Using the oxide hard mask, the periphery area is block. The current spreading layer 421 is formed in the active area by a current spreading layer implant process. The area for forming the current spreading layer 421 is the active area and the block area is the periphery area. As shown in the previous embodiment, the periphery area surrounds the active area. After forming the current spreading layer 421, the oxide hard mask is removed.

Figure 4C:
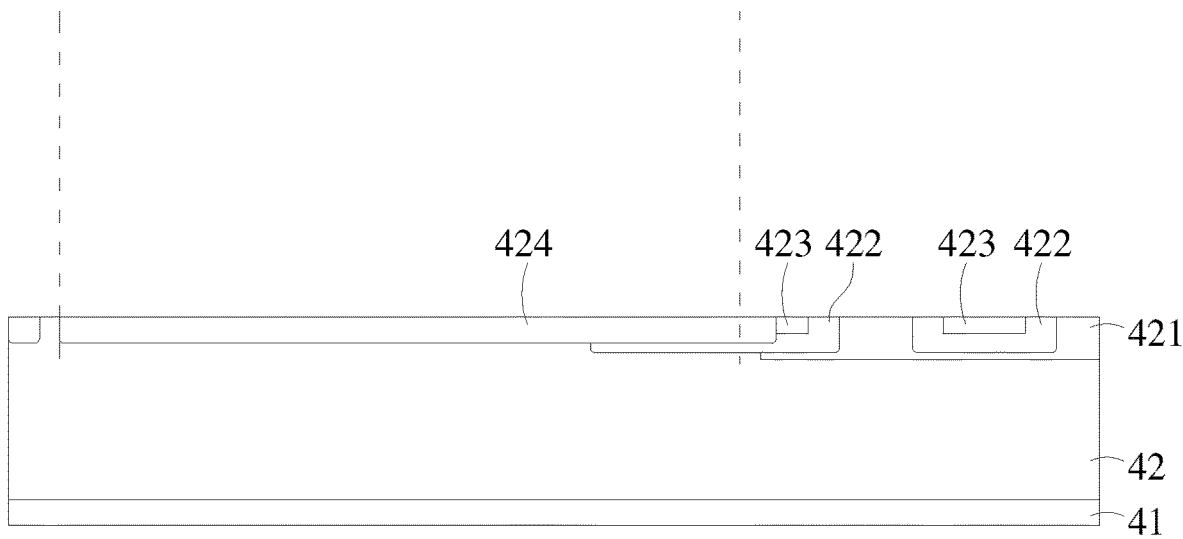

In FIG. 4C, the manufacturing process conducts first implant process to a front surface of the epitaxial layer to form a doped layer. After forming the current spreading layer 421, a first implant process is conducted to form the doped layer. The doped layer includes a P-well layer 422, N-plus layer 423 and P-plus layer 424. At the active area, the P-well layer 422 is formed in the current spreading layer 421 and the N-plus layer 423 is disposed within the P-well layer 422. At the periphery area and the junction area between the active area and the periphery area, the doped layer includes a P-plus layer 424. The detail process of the first implant process will be described in the following embodiment.

Figure 4D:
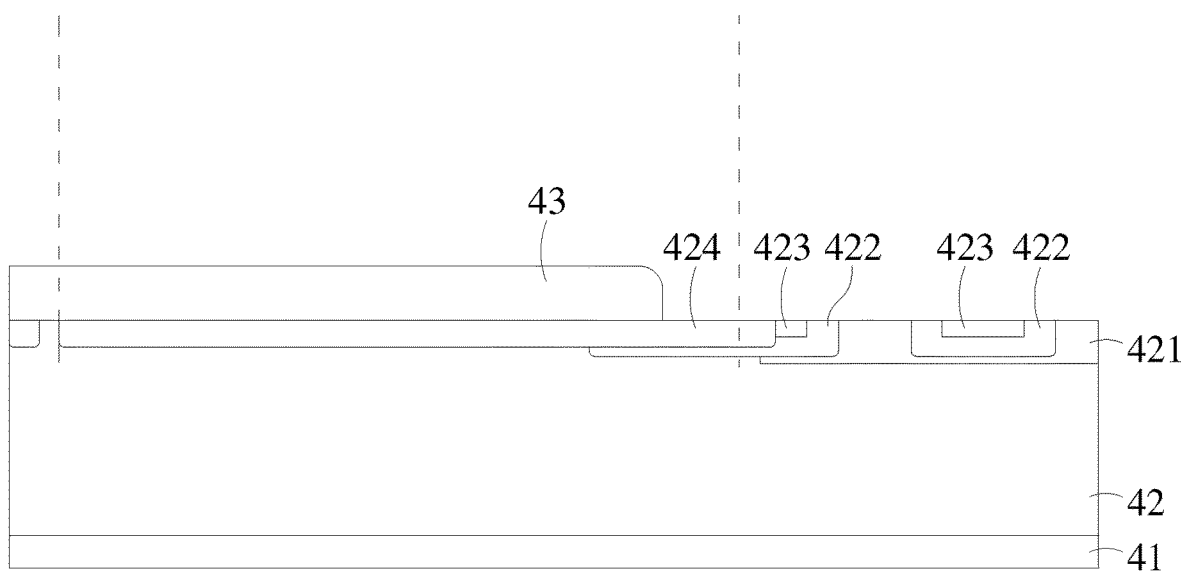

In FIG. 4D, the manufacturing process forms a field oxide layer 43 on the epitaxial layer 42 by a field oxide deposition process. After forming the epitaxial layer 42 and the doped layer, the field oxide deposition process is conducted to form the field oxide layer 43. The field oxide layer 43 in the periphery area conducts the photo and etching process to form the preset thickness of the field oxide layer 43. The field oxide layer 43 may conduct an oxidation process to form the field oxide layer 43 covering the epitaxial layer 42.

Figure 4E:
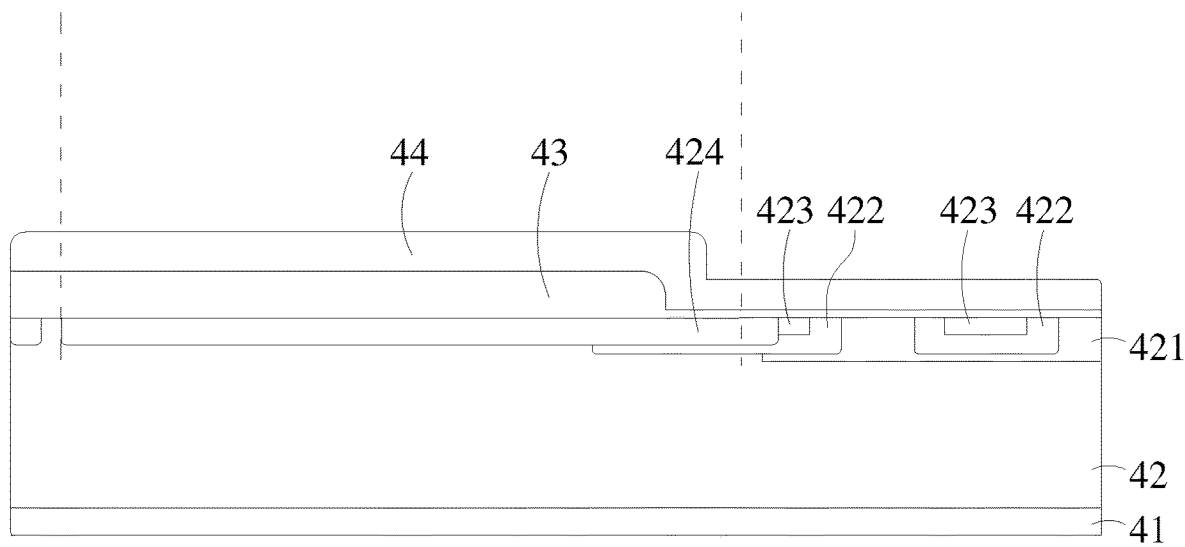

In FIG. 4E, the manufacturing process forms a polysilicon layer 44 on the field oxide layer 42 by a gate polysilicon deposition process. The gate polysilicon deposition process is conducted to form the polysilicon layer 44. As mentioned in the previous embodiment, the polysilicon layer 44 is an undoped polysilicon layer. The doped regions are made by the following steps.

Figure 4F:
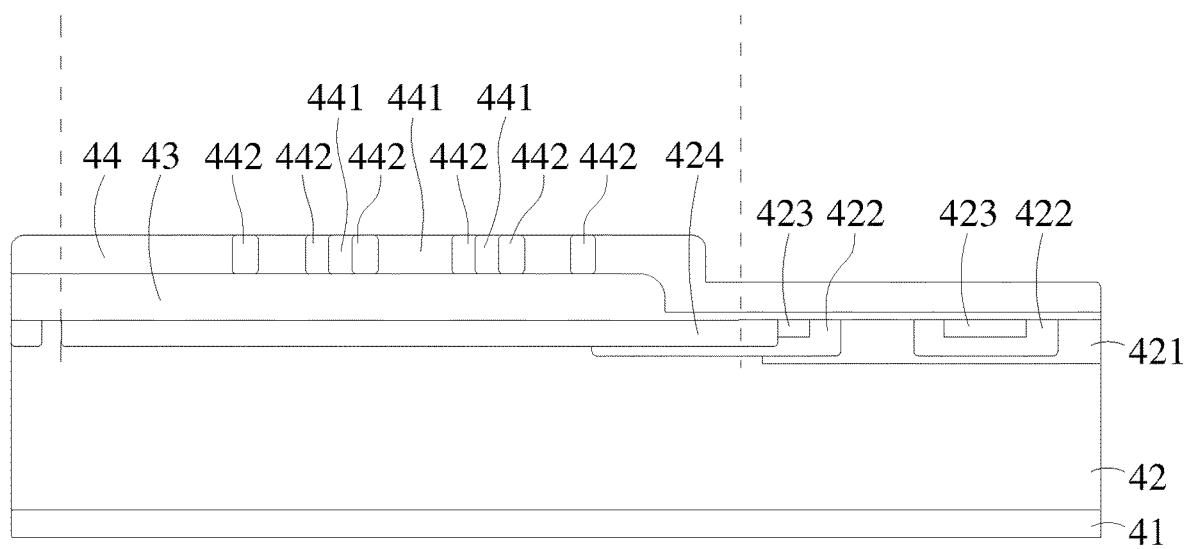

In FIG. 4F, the manufacturing process conducts a second implant process to the polysilicon layer 44 to form a plurality of P-plus regions 442 and a plurality of N-plus regions 441, the plurality of P-plus regions 442 and the plurality of N-plus regions 441 at the periphery area being alternatively arranged. Firstly, the N-plus mask is used. After photo and etching process, the N-plus hard mask defines the locations of the plurality of N-plus regions 441. The phosphorus ions are used to implant through the N-plus hard mask for forming the plurality of N-plus regions 441.

After forming the N-plus regions 441, the N-plus hard mask is removed. The P-plus mask is used to define the locations of the plurality of P-plus regions 442. The boron ions are used to implant through the P-plus hard mask for forming the plurality of P-plus regions 442. The plurality of P-plus regions 442 and the plurality of N-plus regions 441 at the periphery area being alternatively arranged like the PN array. After forming the P-plus regions 442, the P-plus hard mask is removed and an annealing process is provided after the second implant process.

Figure 4G:
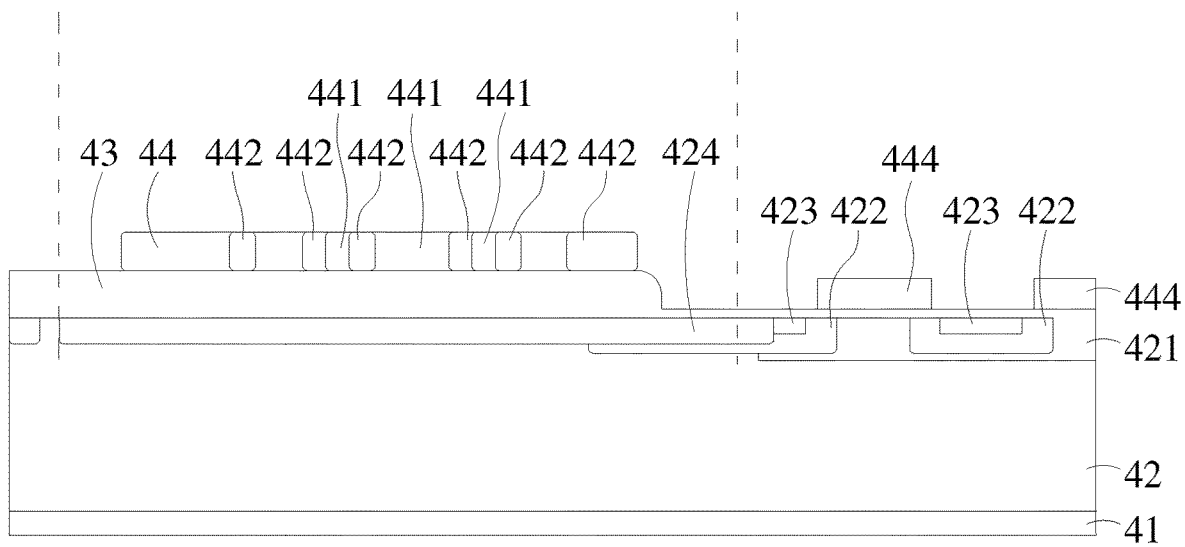

In FIG. 4G, the manufacturing process etches the plurality of P-plus regions 442 and the plurality of N-plus regions 441 to define a zener diode 443 at the periphery area and a polysilicon gate 444 at the active area. After forming the plurality of P-plus regions 442 and the plurality of N-plus regions 441, the gate mask is used to define the location of the gate polysilicon. The etching process is conducted to form the zener diode 443 at the periphery area and the polysilicon gate 444 at the active area.

In the present embodiment, the plurality of P-plus regions 442 and the plurality of N-plus regions 441 are formed in a ring shape. The ring shape may have rounded corners. Each doped ring region of the plurality of P-plus regions 442 and the plurality of N-plus regions 441 has a region width. The region width of each doped ring region of the plurality of P-plus regions 442 and the plurality of N-plus regions 441 can be the same.

Figure 4H:
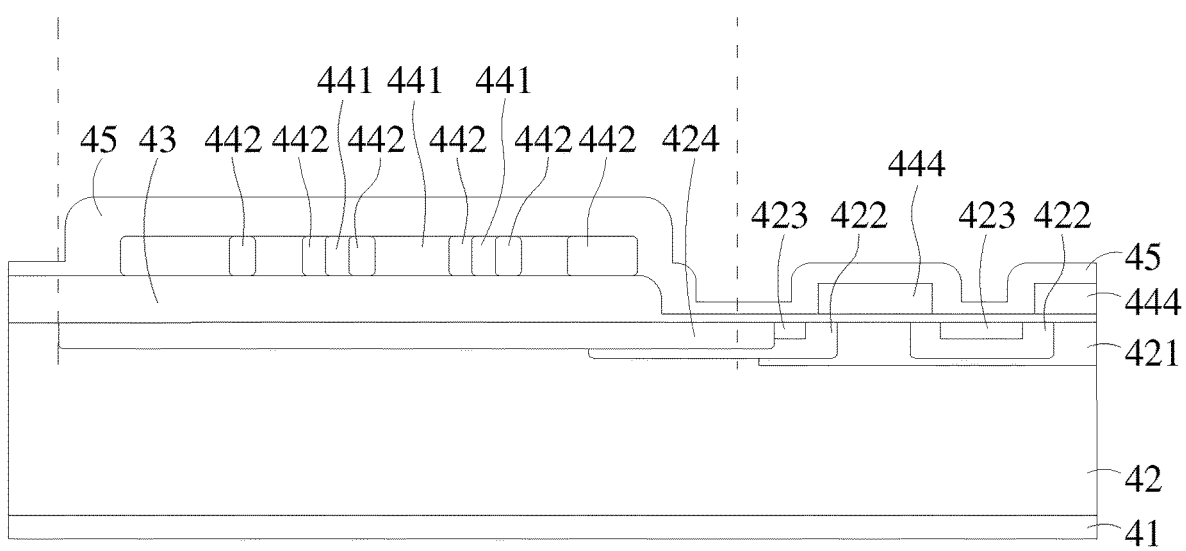

In FIG. 4H, the manufacturing process forms a dielectric layer 45 by an interlayer dielectric deposition process to cover the zener diode 443 and the polysilicon gate 444. After forming the polysilicon gate structure at the active area and the periphery area, the interlayer dielectric deposition process is conducted to form the dielectric layer 45. The thickness of the dielectric layer 45 is about 0.55-0.95 μm.

Figure 4I:
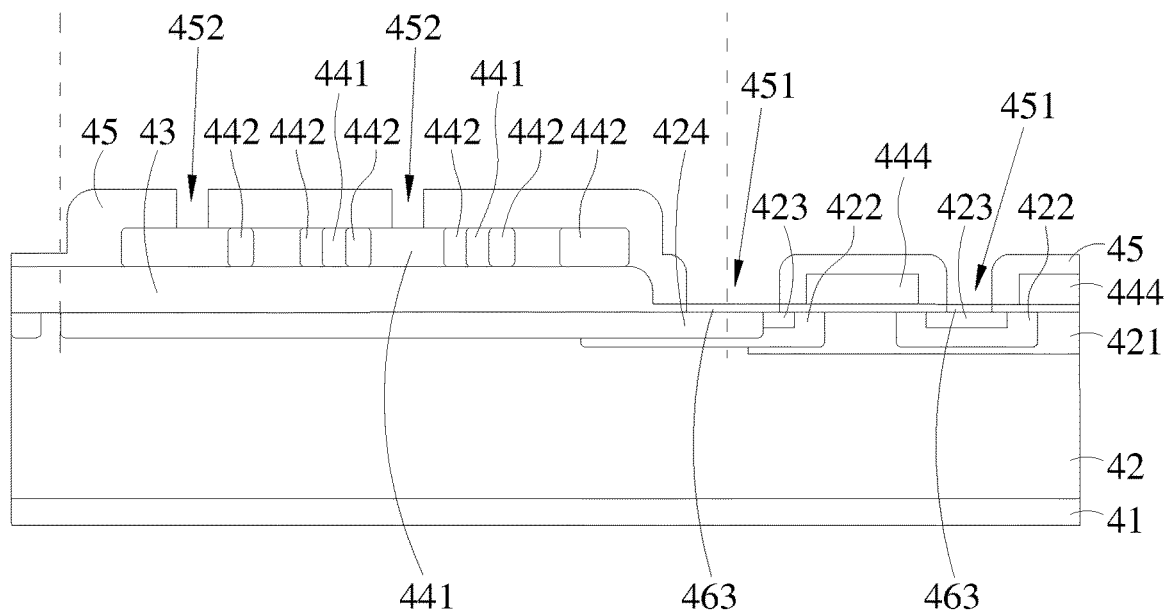

In FIG. 4I, the manufacturing process etches the dielectric layer 45 to form a first contact hole 451 at the active area and a second contact hole 452 at the periphery area. After forming the dielectric layer 45, the etching process is conducted to form the first contact hole 451 and a second contact hole 452. The first contact hole 451 exposes the doped layer, so that the metal contact can electrically connect to the doped layer. At the periphery area, the second contact hole 452 exposes the polysilicon layer 44, so that the P-plus regions 442 and the N-plus regions 441 may electrically connect to the metal contact for forming the zener diode 443. The first contact hole 451 may conduct a nickel deposition process to form a nickel stripe 463 on the bottom of the first contact hole 451.

Figure 4J:
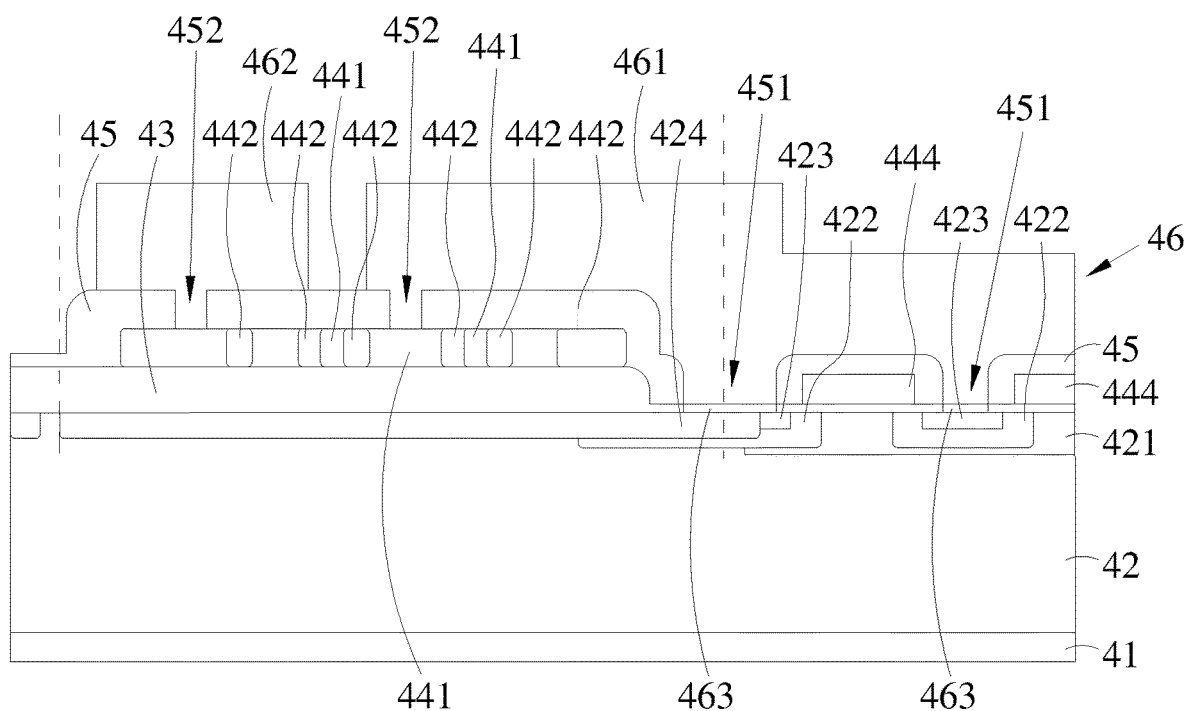

In FIG. 4J, the manufacturing process forms a metal contact layer 46 by a metal deposition process, the metal contact layer 46 is etched to define a source metal 461 and a gate metal 462, the source metal 461 electrically connects to the doped layer through the first contact hole 451, the source metal 461 and the gate metal 462 electrically connects to the zener diode 443 through the second contact hole 452. The manufacturing process forms the metal contact layer 46 by the metallization process. The conductive materials like Aluminum (Al), Chrome (Cr), Copper (Cu), Nickel (Ni), Gold (Au) and so on can be deposited on the dielectric layer 45 and filled in the contact hole to form the metal contact layer 46. Then the metal contact layer 46 is etched to define the source metal 461 and the gate metal 462. The source metal 461 and the gate metal 462 are separated and are respectively used as the source electrode and the gate electrode.

At the active area, the source metal 461 electrically connects to the P-plus layer 424 and N-plus layer 423 through the first contact hole 451. At the periphery area, the source metal 461 and the gate metal 462 electrically connecting to the zener diode 443 through the second contact hole 452. In detail, the second contact hole 452 to the source metal 461 connects to the inner doped region of the plurality of P-plus regions 442 and the plurality of N-plus regions 441. The second contact hole 452 to the gate metal 462 connects to the outer doped region of the plurality of P-plus regions 442 and the plurality of N-plus regions 441. Based on the above process, the PN continuous structure with highly doped regions may form the zener diode 443 connecting to the source end and the gate end.

Figure 5A:
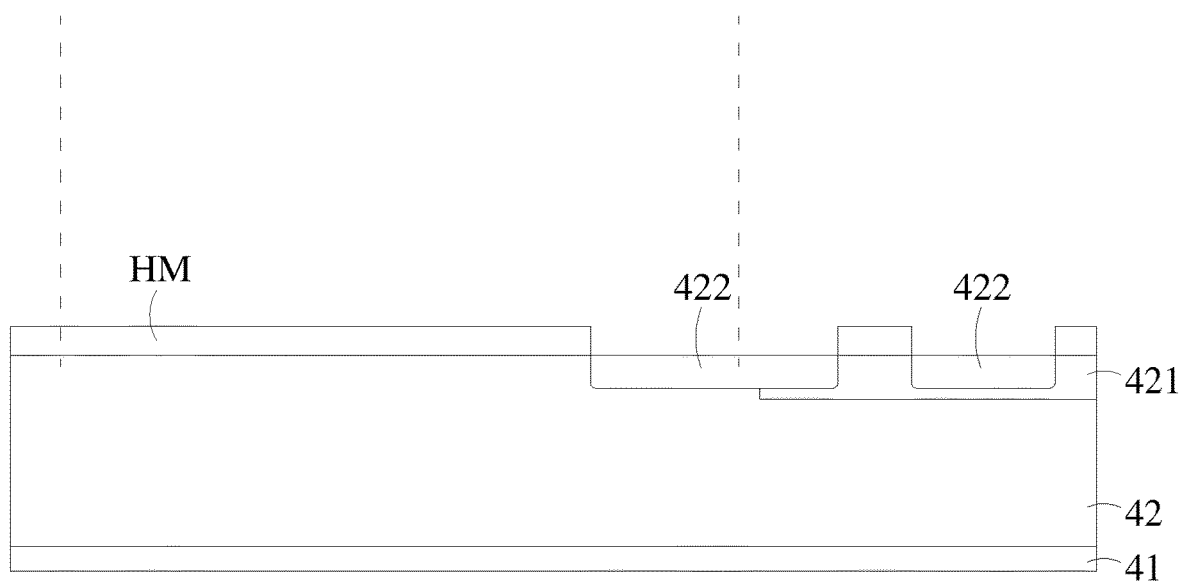
FIG. 5A to FIG. 5C are schematic diagrams of the manufacturing process of the first implant process in accordance with another embodiment of the present disclosure.
Figure 5B:
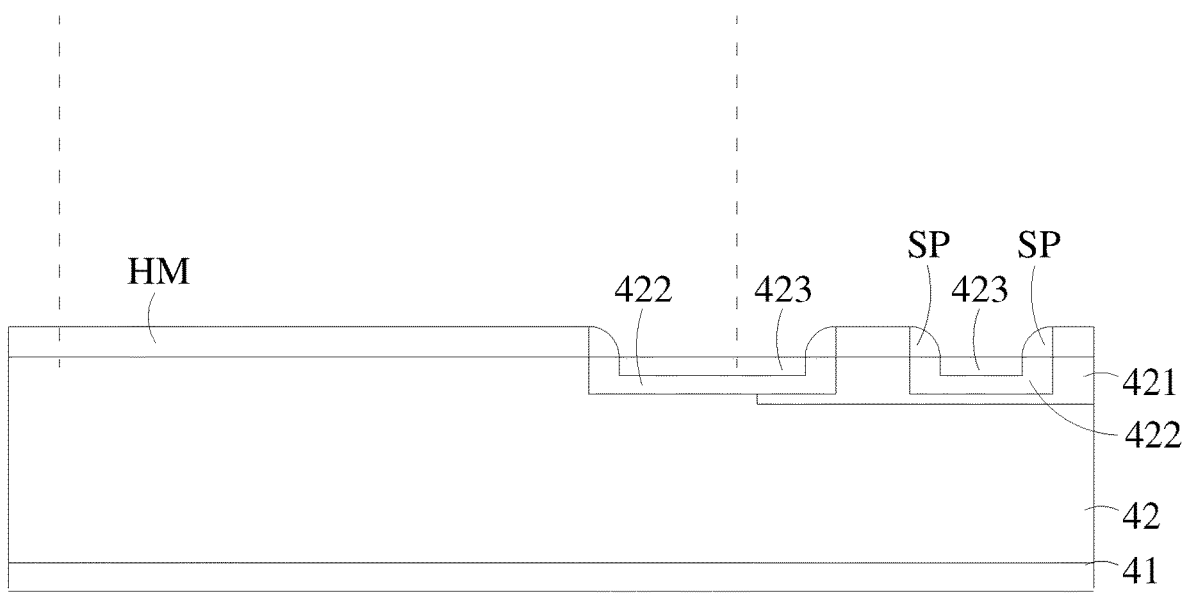
Figure 5C:
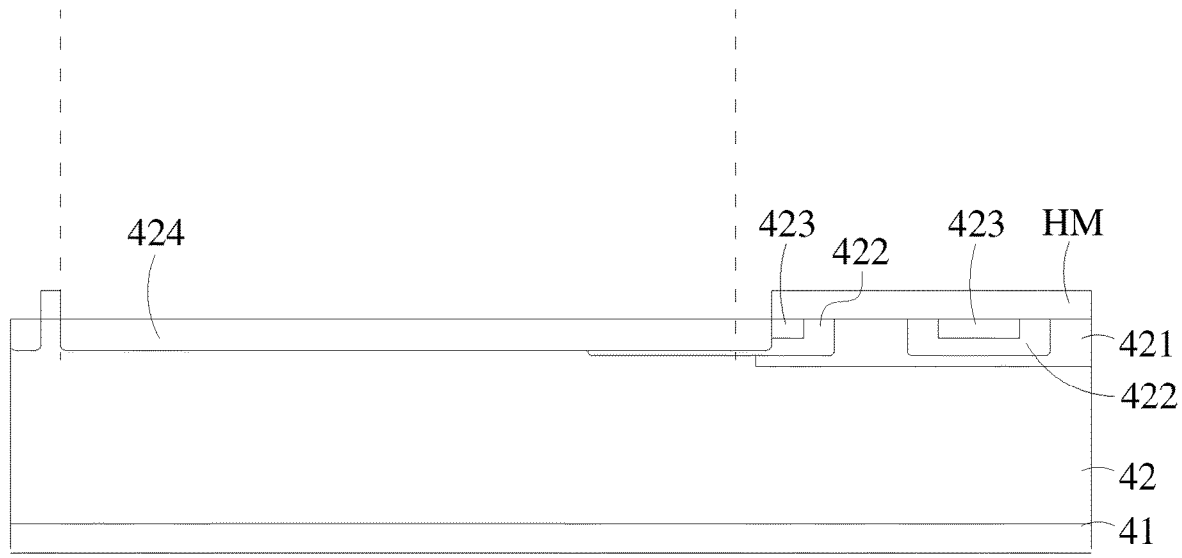

Please refer to FIG. 5A to FIG. 5C, which are the schematic diagrams of the manufacturing process of the first implant process in accordance with the embodiment of the present disclosure. FIG. 5A to FIG. 5C show the section view of the semiconductor device along the dash line AA' of the FIG. 1A.

In FIG. 5A, the manufacturing process provides P-well implant process for forming a P-well layer. The present step follows the step described in FIG. 4B. The epitaxial layer 42 is disposed on the semiconductor substrate 41 and the current spreading layer 421 is disposed in the epitaxial layer 42. In this step, the manufacturing process uses hard mask HM to define the location of the P-well layer. The P-well implant process is conducted to form the P-well layer 422. The P-well layer 422 is disposed in the current spreading layer 421.

In FIG. 5B, the manufacturing process forms a nitrogen implant for forming a N-plus layer 423. In this step, the spacer SP is formed on the sidewall of the hard mask HM. The spacer SP and the hard mask HM are used as the mask for forming the N-plus layer 423. The N-plus implant process uses nitrogen ions for forming the N-plus layer 423. After forming the N-plus layer 423, the hard mask HM and the spacer SP are removed.

In FIG. 5C, the manufacturing process conducts an aluminum implant for forming a P-plus layer 424. In this step, the hard mask is used to define the P-plus layer 424. The hard mask conducts the photo and etching process. Then P-plus implant process uses aluminum ions are conducted to form the P-plus layer 424. The P-plus layer 424 is adjacent to the N-plus layer 423. After forming the P-plus layer 424, the hard mask HM is removed and an annealing process is provided after the implant process.

The above steps provide the embodiment of forming the doped layer. However, the present disclosure is not limited on this embodiment. In other embodiment, the doped layer and the manufacturing method of forming the doped layer can be adjusted according the type of the semiconductor device.

Figure 6A:
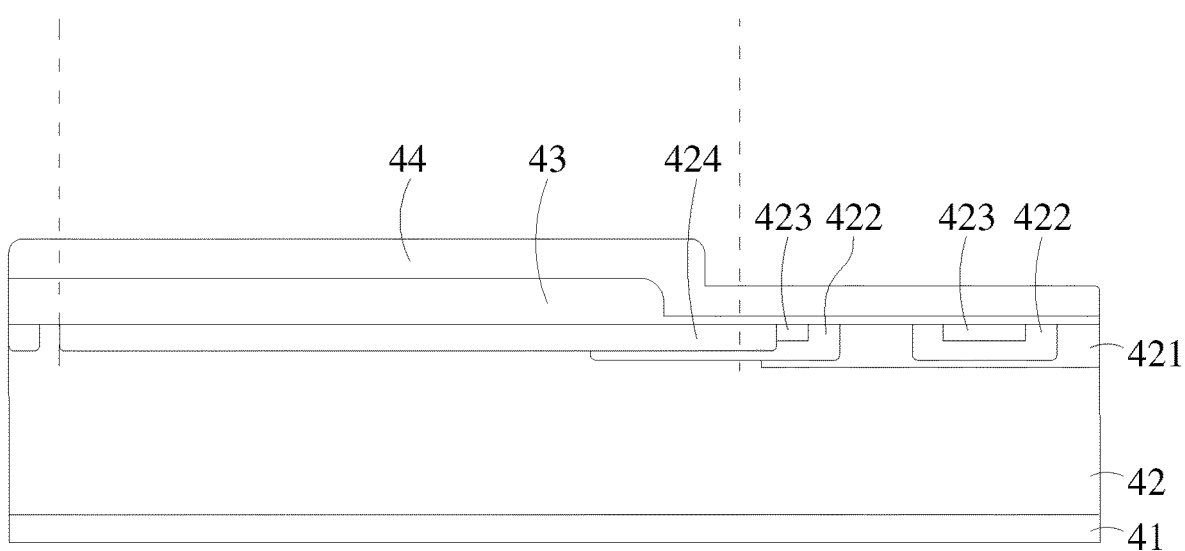
FIG. 6A to FIG. 6C are the schematic diagrams of the manufacturing process of forming the zener diode in accordance with the embodiment of the present disclosure.
Figure 6B:
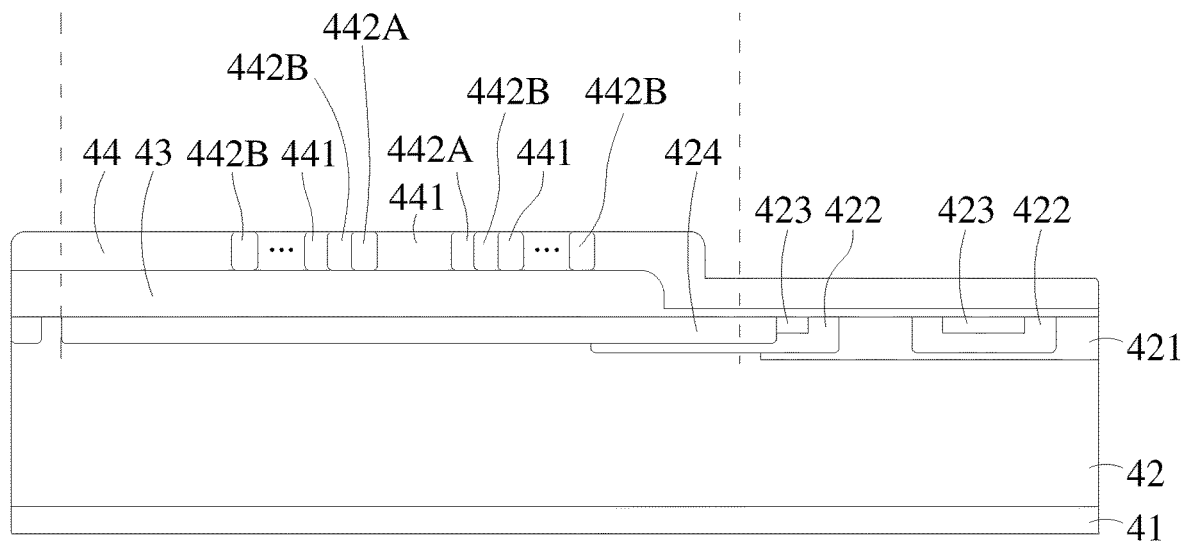
Figure 6C:
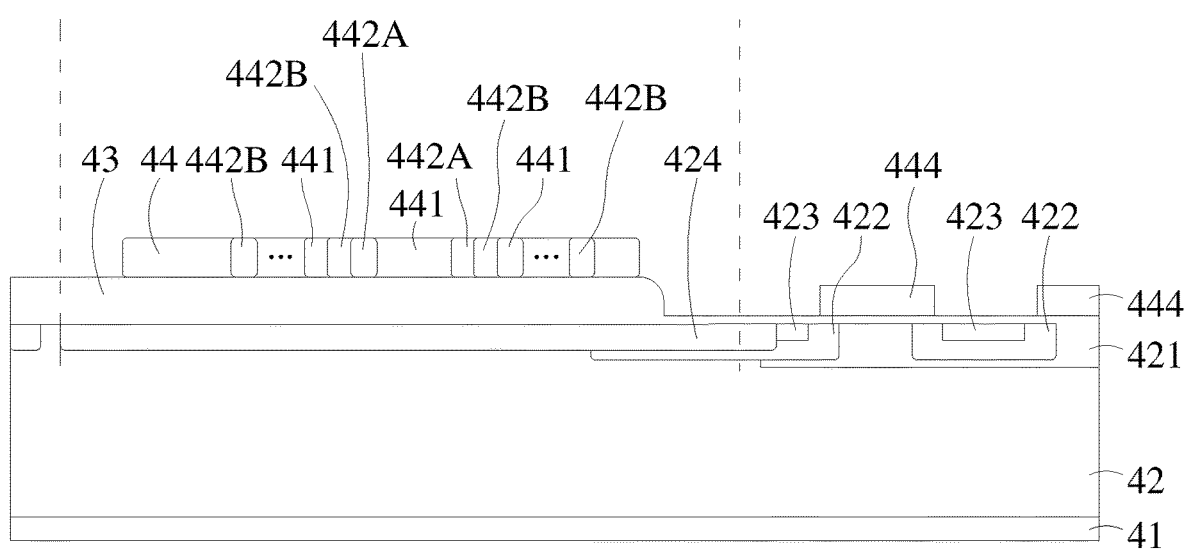

Please refer to FIG. 6A to FIG. 6C, which are the schematic diagrams of the manufacturing process of forming the zener diode in accordance with the embodiment of the present disclosure. FIG. 6A to FIG. 6C show the section view of the semiconductor device along the dash line AA' of the FIG. 1A.

In FIG. 6A, the manufacturing process forms a polysilicon layer 44 on the field oxide layer 42 by a gate polysilicon deposition process. The gate polysilicon deposition process is conducted to form the polysilicon layer 44. The polysilicon layer 44 is an undoped polysilicon layer. The present step is similar to the step described in FIG. 4E.

In FIG. 6B, the manufacturing process conducts a second implant process to the polysilicon layer 44 to form a plurality of first P-plus regions 442A, second P-plus regions 442B and N-plus regions 441, the N-plus regions 441, the first P-plus regions 442A and the second P-plus regions 442B are alternatively arranged. Firstly, the N-plus mask is used. After photo and etching process, the N-plus hard mask defines the locations of the plurality of N-plus regions 441. The phosphorus ions are used to implant through the N-plus hard mask for forming the plurality of N-plus regions 441.

After forming the N-plus regions 441, the N-plus hard mask is removed. The first P-plus mask is used to define the locations of the first P-plus regions 442A. The boron ions are used to implant through the first P-plus hard mask for forming the plurality of first P-plus regions 442A. Then the second P-plus mask is used to define the location of the second P-plus regions 442B and the boron ions are implanted to the polysilicon layer 44 to form the second P-plus regions 442B. The first P-plus regions 442A have higher doping concentration than the second P-plus regions 442B. The first P-plus regions 442A and the second P-plus regions 442B form the highly doped P regions. The N-plus regions 441 and the highly doped P regions are alternatively arranged like the PN array. After forming the second P-plus regions 442B, the second P-plus hard mask is removed and an annealing process is provided after the second implant process.

In FIG. 6C, the manufacturing process etches the plurality of N-plus regions 441 to define a zener diode 443 at the periphery area and a polysilicon gate 444 at the active area. After forming the first P-plus regions 442A, the second P-plus regions 442B and the N-plus regions 441, the gate mask is used to define the location of the gate polysilicon. The etching process is conducted to form the zener diode 443 at the periphery area and the polysilicon gate 444 at the active area.

After the above etching process, the manufacturing process may continue the process described in FIG. 4H, That is, the following process may form the dielectric layer, the contact hole and the metal contact. The similar process refers to the embodiment described in FIG. 4H to FIG. 4J, the same content will not be repeated here.

Figure 7A:
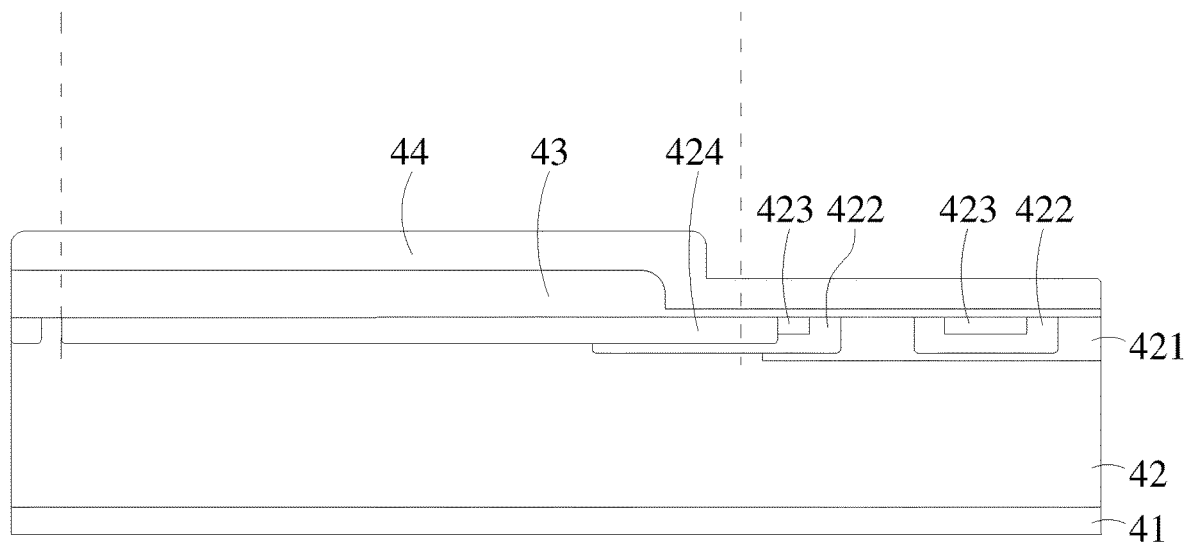
FIG. 7A to FIG. 7C are the schematic diagrams of the manufacturing process of forming the zener diode in accordance with another embodiment of the present disclosure.
Figure 7B:
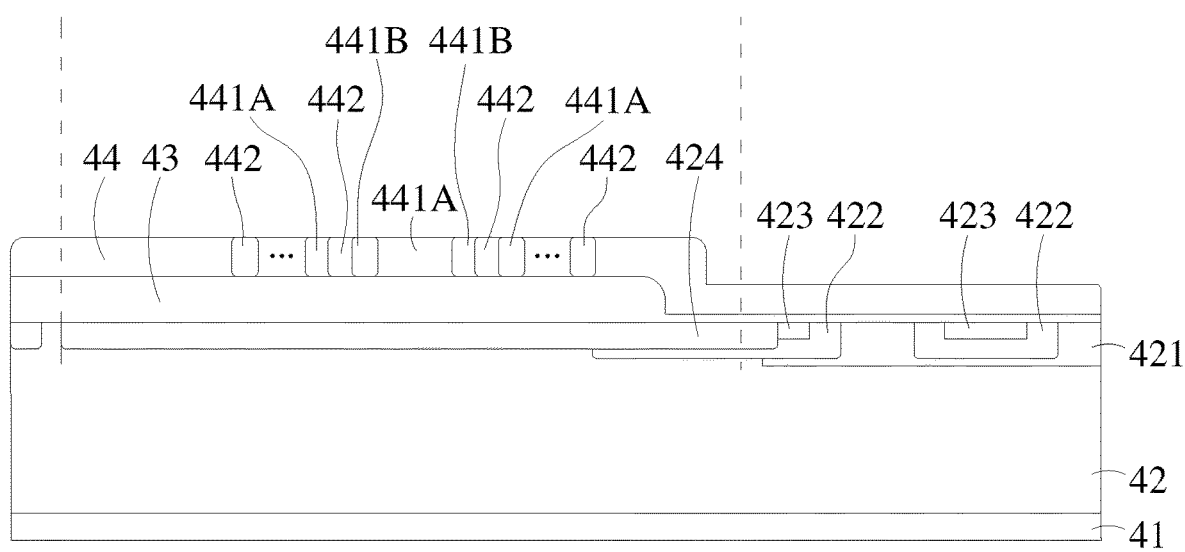
Figure 7C:
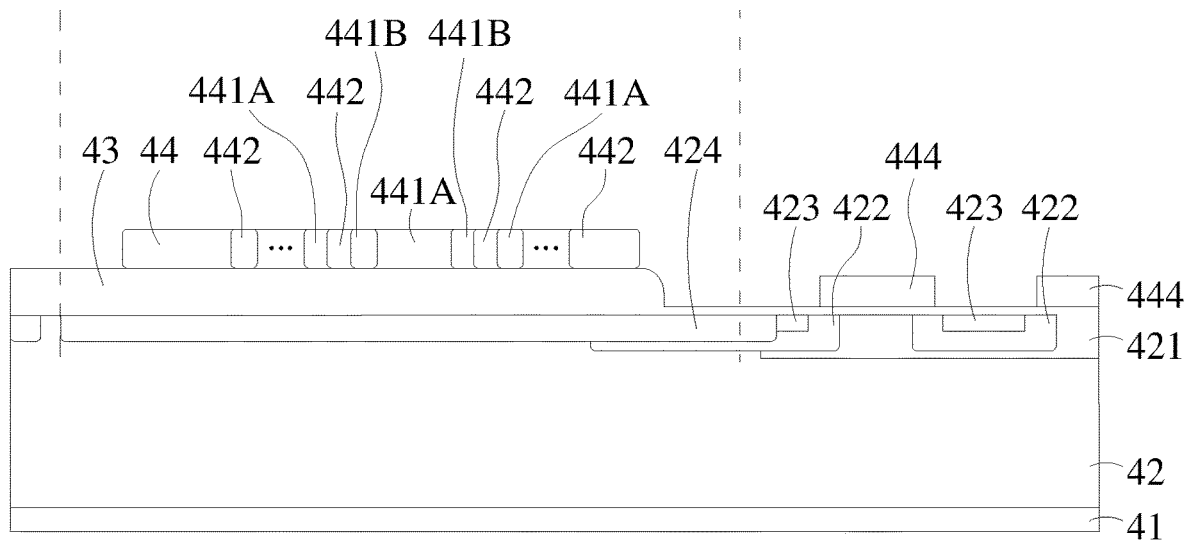

Please refer to FIG. 7A to FIG. 7C, which are the schematic diagrams of the manufacturing process of forming the zener diode in accordance with another embodiment of the present disclosure. FIG. 7A to FIG. 7C show the section view of the semiconductor device along the dash line AA' of the FIG. 1A.

In FIG. 7A, the manufacturing process forms a polysilicon layer 44 on the field oxide layer 42 by a gate polysilicon deposition process. The gate polysilicon deposition process is conducted to form the polysilicon layer 44. The polysilicon layer 44 is an undoped polysilicon layer. The present step is similar to the step described in FIG. 4E.

In FIG. 7B, the manufacturing process conducts a second implant process to the polysilicon layer 44 to form a plurality of first N-plus regions 441A, second N-plus regions 441B and P-plus regions 442, the first N-plus regions 441A, the second N-plus regions 441B and the P-plus regions 442 are alternatively arranged. Firstly, the first N-plus mask is used. After photo and etching process, the first N-plus hard mask defines the locations of the plurality of first N-plus regions 441A. The phosphorus ions are used to implant through the first N-plus hard mask for forming the plurality of first N-plus regions 441A. Then the first N-plus mask is change to the second N-plus mask. The second N-plus hard mask defines the locations of the plurality of second N-plus regions 441B. The phosphorus ions are used to implant through the second N-plus hard mask for forming the plurality of second N-plus regions 441B. The first N-plus regions 441A have higher doping concentration than the second N-plus regions 441B.

After forming the second N-plus regions 441B, the second N-plus hard mask is removed. The P-plus mask is used to define the locations of the P-plus regions 442. The boron ions are used to implant through the P-plus hard mask for forming the plurality of P-plus regions 442. The first N-plus regions 441A and the second N-plus regions 441B form the highly doped N regions. The highly doped N regions and the P-plus regions 442 are alternatively arranged like the PN array. After forming the P-plus regions 442, the P-plus hard mask is removed and an annealing process is provided after the second implant process.

In FIG. 7C, the manufacturing process etches the plurality of first N-plus regions 441A to define a zener diode 443 at the periphery area and a polysilicon gate 444 at the active area. After forming the first N-plus regions 441A, the second N-plus regions 441B and the P-plus regions 442, the gate mask is used to define the location of the gate polysilicon. The etching process is conducted to form the zener diode 443 at the periphery area and the polysilicon gate 444 at the active area.

After the above etching process, the manufacturing process may continue the process described in FIG. 4H, That is, the following process may form the dielectric layer, the contact hole and the metal contact. The similar process refers to the embodiment described in FIG. 4H to FIG. 4J, the same content will not be repeated here.

The present disclosure disclosed herein has been described by means of specific embodiments. However, numerous modifications, variations and enhancements can be made thereto without departing from the spirit and scope of the disclosure set forth in the claims.

What is claimed is:

1. A manufacturing method of forming a semiconductor device, the manufacturing method comprising:
    providing a semiconductor substrate and disposing an epitaxial layer on the semiconductor substrate, the semiconductor substrate having a silicon carbide layer;
    forming a current spreading layer to define an active area and a periphery area surrounding the active area;
    conducting a first implant process to a front surface of the epitaxial layer to form a doped layer;
    forming a field oxide layer on the epitaxial layer by a field oxide deposition process;
    forming a polysilicon layer on the field oxide layer by a gate polysilicon deposition process;
    conducting a second implant process to the polysilicon layer to form a plurality of P-plus regions and a plurality of N-plus regions, the plurality of P-plus regions and the plurality of N-plus regions at the periphery area being alternatively arranged;
    etching the plurality of P-plus regions and the plurality of N-plus regions to define a zener diode at the periphery area and a polysilicon gate at the active area, wherein doped ring regions of the plurality of P-plus regions and the plurality of N-plus regions are each formed in a ring shape with rounded corners;
    forming a dielectric layer by an interlayer dielectric deposition process to cover the zener diode and the polysilicon gate;
    etching the dielectric layer to form a first contact hole at the active area and two second contact holes at the periphery area, wherein the doped ring regions of the plurality of P-plus regions and the plurality of N-plus regions are each configured to surround one second contact hole among the two second contact holes connected to a source metal, the doped layer is configured to be exposed by the first contact hole, and the polysilicon layer is configured to be exposed by each of the two second contact holes;
    forming a metal contact layer by a metal deposition process, the metal contact layer being etched to define the source metal and a gate metal, the source metal electrically connecting to the doped layer through the first contact hole, the source metal and the gate metal electrically connecting to the zener diode through the respective ones of the second contact holes, and wherein an inner ring of the plurality of N-plus regions is configured to be connected to the one second contact hole among the two second contact holes connected to the source metal, and an outer ring of the plurality of N-plus regions is configured to be connected to one other second contact hole among the two second contact holes connected to the gate metal.

2. The manufacturing method of claim 1, wherein the doped ring regions of the plurality of P-plus regions and the plurality of N-plus regions each has a region width.

3. The manufacturing method of claim 1, wherein the plurality of P-plus regions comprise first P-plus regions and second P-plus regions, and the N-plus regions, the first P-plus regions and the second P-plus regions are alternatively arranged to form the zener diode, wherein the first P-plus regions have higher doping concentration than the second P-plus regions.

4. The manufacturing method of claim 1, wherein the plurality of N-plus regions comprise first N-plus regions and second N-plus regions, and the first N-plus regions, the second N-plus regions and the P-plus regions are alternatively arranged to form the zener diode, wherein the first N-plus regions have higher doping concentration than the second N-plus regions.

5. The manufacturing method of claim 1, wherein the second implant process comprises a phosphorus implant for forming the plurality of N-plus regions and a boron implant for forming the plurality of P-plus regions.

6. The manufacturing method of claim 5, wherein an annealing process is provided after the second implant process.

7. The manufacturing method of claim 1, wherein the first implant process comprises a P-well implant process for forming a P-well layer, a nitrogen implant for forming a N-plus layer and an aluminum implant for forming a P-plus layer, the N-Plus layer is disposed within the P-well layer and the P-plus layer is adjacent to the N-plus layer.

8. The manufacturing method of claim 7, wherein an annealing process is provided after the first implant process.

9. The manufacturing method of claim 1, wherein a nickel deposition process is provided to form a nickel layer is between the source metal and the doped layer.

* * * * *